United States Patent
Tsai et al.

[11] Patent Number: 5,821,153
[45] Date of Patent: Oct. 13, 1998

[54] METHOD TO REDUCE FIELD OXIDE LOSS FROM ETCHES

[75] Inventors: Chaochieh Tsai, Taichung, Taiwan; Chin-Hsiung Ho, Sunnyvale, Calif.

[73] Assignee: Taiwan Semiconductor Manufacturing Company, Ltd., Hsin-Chu, Taiwan

[21] Appl. No.: 761,885

[22] Filed: Dec. 9, 1996

[51] Int. Cl.[6] .................................................. H01L 21/76
[52] U.S. Cl. ........................... 438/439; 438/769; 438/775
[58] Field of Search .................................... 438/439, 440, 438/442, 443, 444, 448, 449, 452, 762, 769, 775, 229, 230

[56] References Cited

U.S. PATENT DOCUMENTS

| | | | |
|---|---|---|---|
| 5,316,965 | 5/1994 | Philipossian et al. | 437/70 |
| 5,338,968 | 8/1994 | Hodges et al. | 257/647 |
| 5,429,982 | 7/1995 | Chao | 437/69 |
| 5,573,974 | 11/1996 | Hwang . | |
| 5,661,072 | 8/1997 | Jeng . | |

OTHER PUBLICATIONS

Y. Hayafugi et al, "Nitridation of Silicon and Oxidized–Silicon", J. Electrochem Soc, 129, 2102–2108, Sep. 1982.
Ghandhi, "VLSI Fabrication Principles", 2nd Edition, John Wiley & Sons, Inc. pp. 484–485.

*Primary Examiner*—George R. Fourson
*Attorney, Agent, or Firm*—George O. Saile; Stephen B. Ackerman; William J. Stoffel

[57] ABSTRACT

The present invention provides a method of manufacturing a high nitrogen (N) content oxynitride layer 34A 34B over field oxide regions. The oxynitride layer 34A 34B prevents subsequent etches from forming recesses in the field oxide regions 30 and planarizes the surface. The method begins by forming a field oxide region 30 an isolation area in the substrate 22. A high N content oxynitride protection layer 34A 34B (an etch barrier) is then formed surrounding (over and under) the field oxide layer 30. The high N content oxynitride protection layer 34A 34B is formed by heating (e.g., annealing) the substrate in a gas environment comprising ammonia. The high N content oxynitride layer is preferably formed by rapidly thermally annealing the substrate at temperature between about 825° and 875° C. in an ammonia containing environment with a partial pressure of between about 0.5 and 1.2 kg/cm$^2$. The top high N content oxynitride layer 34A over the central area of the field is preferably removed while the top and bottom high content oxynitride layers 34A 34B remain at the periphery of the field oxide.

16 Claims, 3 Drawing Sheets

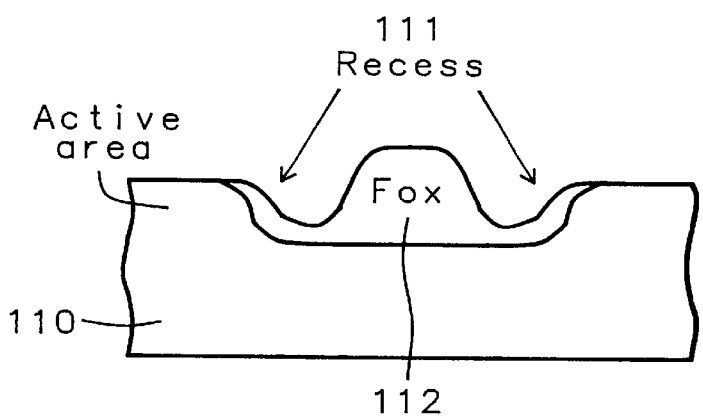
FIG. 1 — Prior Art
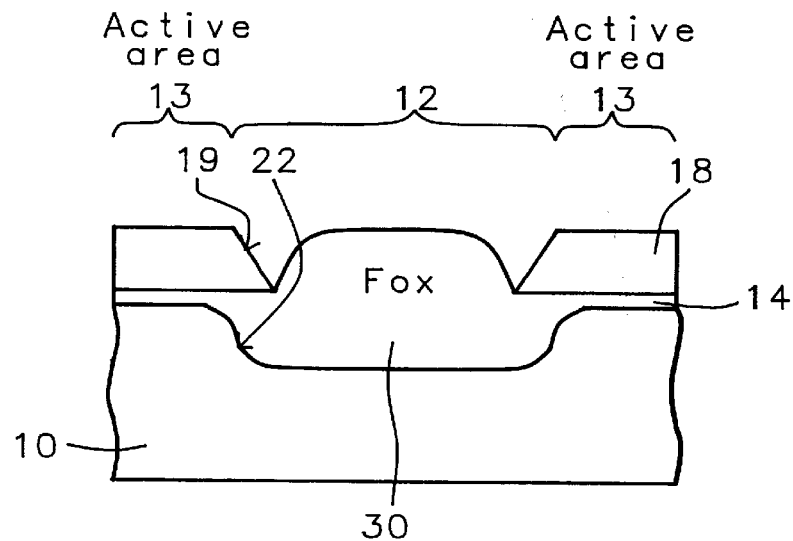
FIG. 2
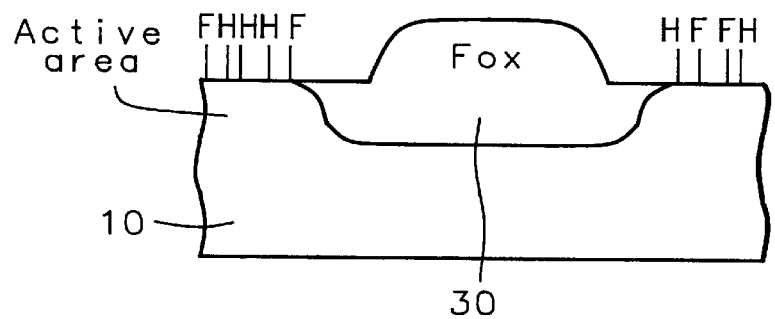
FIG. 3

METHOD TO REDUCE FIELD OXIDE LOSS FROM ETCHES

BACKGROUND OF INVENTION

1) Field of the Invention

This invention relates generally to the fabrication of field oxide isolation regions for a semiconductor device and more particularly to the fabrication of a high nitrogen (N) content oxynitride layer over a field oxide region.

2) Description of the Prior Art

The trend to continue to miniaturize semiconductor integrated circuits to achieve submicron feature sizes and increase the number of devices fabricated on the integrated circuit has required smaller isolation areas between devices. The active areas where devices are built are isolated by a layer of oxide known as field oxide (i.e., FOX). The introduction of LOCOS, local oxidation of silicon, produces regions of insulating silicon dioxide between devices. The LOCOS process was a great technological improvement in reducing the area needed for the isolation regions and decreasing some parasitic capacitances.

In LOCOS, silicon nitride is deposited and patterned over a stress relief pad oxide layer. The silicon nitride layer is retained over the area which further oxidation is not desired. Thus, the silicon nitride is etched to expose a portion of the pad oxide where the field oxide is to be grown. The substrate is thermally oxidized using the silicon nitride as a mask to form the field oxide regions. The silicon nitride layer is removed.

In order to further miniaturize integrated circuits, the retrograde well technology is employed in deep submicron MOSFET's to increase the packing density and to avoid latchup. In the retrograde well process, the field oxide is first formed on the substrate using the process described above. Next the active areas between the field oxide regions are implanted with an impurity to form a well. The retrograde well has the advantage of not being enlarged by the field oxide thermal cycle. Because of that the retrograde well has less vertical and lateral diffusion compared to the conventional well which is formed before the field oxide. For example, since the lateral diffusion is about 0.7 times the junction depth, a typical diffused well of 3 to 4 microns results in a narrow spread of well doped of about 2 to 3 microns. If a higher energy implant is used to place the dopants at the desired depth without significant additional diffusions, much less lateral dopant spread occurs.

As shown in FIG. 1, one problem with the retrograde well technology is that recesses 111 are formed in the field oxide 112 near the outer edges of the field oxide. These recesses 111 near the active areas are formed during subsequent etches, such as the etching of the silicon nitride oxidation mask, the well drive in oxide removal, spacer formation and the sacrificial oxide removal. FIG. 1 shows the recesses 111 in the field oxide in the substrate 110. These recesses may cause problems of current leakage. In addition due to the recesses, step coverage in the subsequent process steps is more difficult.

Some practitioners have attempted to solve other different problems in field oxide formation. For example, U.S. Pat. No. 5,316,965 (Philipossian et al.) teaches a method of implanting a FOX with $N_2$ and then annealing to produce a hardened and etch resistance FOX. U.S. Pat. No. 5,429,982 (Chao) teaches a method reducing birds beak by growing a buffer oxide layer in a thermal process with $N_2O$. This allows a layer of N atoms to pile up at the interface between the wafer and the buffer oxide layer. U.S. Pat. No. 5,338,968 (Hodges) shows a method of forming a FOX where $N_2$ is implanted into a polysilicon buffer layer. A nitride layer is formed over the polysilicon buffer layer. Y. Hayafugi et al., "Nitridation of Silicon and Oxidized - Silicon", J. Electrochem. Soc. 129, 2102–2108. Sept. 1982, discusses the mechanism of nitridation of oxide layers. Ghandhi, "VLSI Fabrication Principles", 2nd edition, John Wiley & Sons, Inc., pp. 484–485 discusses oxynitride film characteristics. However, the problems caused by recesses in field oxides still must be resolved to increase semiconductor yields.

SUMMARY OF THE INVENTION

It is an object of the present invention to provide a method for fabricating a field oxide region that planarizes the resulting surface and eliminates recesses and bumps.

It is an object of the present invention to provide a method for fabricating a retrograde well near field oxide regions which do not have recesses formed by subsequent etchback steps.

It is an object of the present invention to provide a method for fabricating a retrograde well near field oxide regions and planarizing the resultant surface.

It is an object of the present invention to provide a method for fabricating a field oxide regions which do not have recesses formed by subsequent etchback steps by converting the outer edge of the field oxide regions into a high nitride content oxynitride layer (nearly amorphous silicon nitride) which will protect the field oxide.

To accomplish the above objectives, the present invention provides a method of forming an etch resistant, high nitrogen (N) content oxynitride layer (nearly stoichiometric $Si_3N_4$) surrounding the field oxide regions. This high N content oxynitride layer 34A 34B resists etch processes and thus prevents recesses from forming in the field oxide. The high N content oxynitride layer 34A 34B is formed in the invention's ammonia annealing or RTA process. In an embodiment of the present invention the top oxynitride layer 34A in over the middle of the field oxide is removed (still leaving the oxynitride layer 34A 34B over the outer edges) thereby providing a planar profile.

The method begins by sequentially forming a pad oxide layer 14 and a masking layer 18 composed of silicon nitride over a semiconductor substrate. The substrate has at least an active area 13 and an isolation area 12. An opening 19 is formed in the silicon nitride masking layer 18 over the isolation area 12. A field oxide region 30 is then formed over the isolation area in the substrate 22. The silicon nitride masking layer 18 and pad oxide layer 14 are then removed. The native oxide over the substrate surface is preferably removed (e.g., using a HF dip etch). The HF dip etch completely removes the pad oxide layer 14 and passivates the surface of the substrate in the active area 13 thereby preventing native oxide from growing on the surface of the substrate.

In an important step, a high N content oxynitride layer 34A 34B is then formed around (surrounding) the field oxide layer 30. The high N content oxynitride layer 34 (i.e., 34A and 34B) forms over the top of the field oxide layer 34A and under the field oxide 34B (along the interface between the substrate and the bottom of the field oxide). The high N content oxynitride layer 34A 34B is particularly thick at the periphery of the field oxide where the top and bottom oxynitride layers 34 join. The upper and lower (top and bottom) oxynitride layers 34 provide an etch resistant coating to the field oxide and prevents recesses from forming.

The high N content oxynitride layer 34 is preferably formed by heating the substrate in a gas environment comprising ammonia. The high N content oxynitride layer is preferably formed by rapidly thermally annealing the substrate at temperature between about 825° and 875° C. in an ammonia containing environment.

In a preferred embodiment, the top layer 34A of the oxynitride is removed thereby lowering the level of the field oxide and planarizing the surface.

Next, processes are performed to fabricate semiconductor devices using the field oxide. For example, ions can be implanted into the active areas to form retrograde wells 42. A sacrificial oxide layer 40 is formed over the surface of the substrate over the active area 13. Other ion implantations and photo steps are performed with the masking layer 34 protecting the field oxide. After the etch barrier layer 34 is formed, additional silicon oxide layers (e.g., sacrificial layers) and other layers can be formed over the substrate and field oxide regions. The masking layer 34 protects the field oxide from subsequent etching and photo processes.

The invention provide several advantages over the prior art processes. The method of the current invention forms a high N content oxynitride etch barrier mask layer 34A 34B under and over the field oxide regions. The etch barrier layer 34A 34B protects the field oxide from being excessively etched by subsequent etches. The high N content oxynitride layer 34A 34B protects the field oxide regions 30 from subsequent etches which form recesses in the field oxide.

Two advantages are gained when the top oxynitride layer 34A over central area of the field oxide is removed (e.g., by an etch). First, the central area of the field oxide is not protected from subsequent etch processes and will be planarized (thinned). Second, the thicker oxynitride layer 34A 34B in the outer edges (periphery) of the field oxide remains after the etches and maintains the flat profile. This way, invention planarized the field oxide by thinning the central area and protecting the peripheral areas of the field oxide.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 is a cross sectional view of a field oxide region having recesses formed by the prior art processes.

FIGS. 2 through 6 are cross sectional views for illustrating a method for manufacturing field oxide regions which have an overlying and underlying oxynitride layer which prevent recesses from forming according to the present invention.

DETAILED DESCRIPTION OF THE PREFERRED EMBODIMENTS

Figure 4:
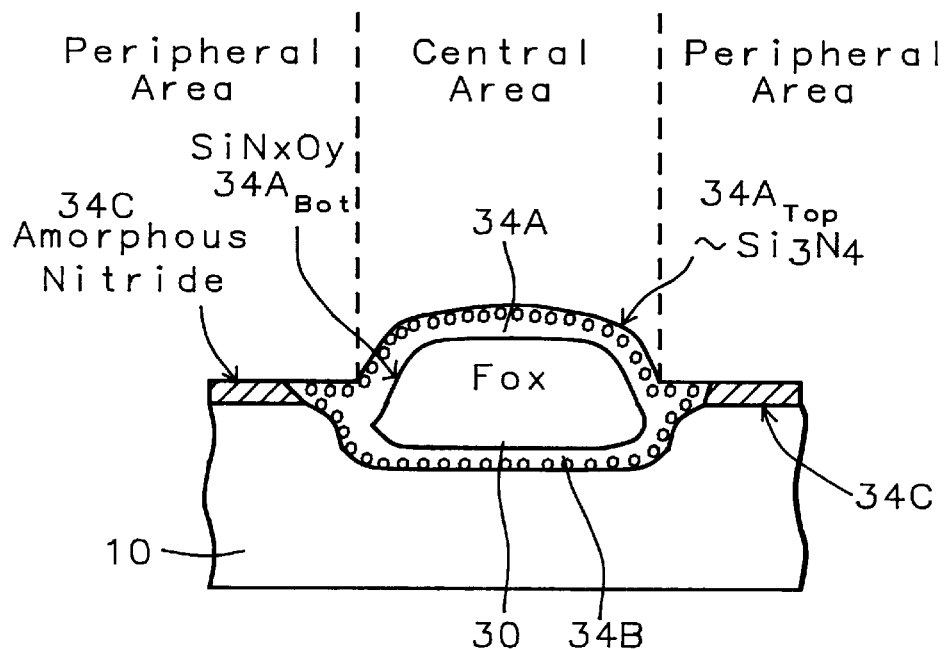

The present invention will be described in detail with reference to the accompanying drawings. The present invention provides a method of forming a high N content oxynitride etch barrier layer 34 surrounding field oxide regions. The thick oxynitride etch barrier layers 34 (34A 34B) are the periphery of the field oxide (FOX) protect the field oxide from being etched.

As shown in FIG. 2, a pad oxide layer 14 is formed over a semiconductor substrate. The substrate 10 has at least an active area 13 and an isolation area 12. The active areas 13 are defined by the isolation areas 12 which will have field oxide 30 formed thereover.

The semiconductor substrate 10 is understood to possibly include a semiconductor wafer, active and passive devices formed within the wafer (including wells) and layers formed on the wafer surface. The term "substrate" is mean to include devices formed within a semiconductor wafer and the layers overlying the wafer.

The pad oxide layer 14 is preferably formed using a conventional thermal oxidation process. The pad oxide layer 14 preferably has a thickness in a range of between about 100 and 120 Å and more preferably about 110 Å.

Next, a masking layer 18 is formed over the pad oxide layer 14. The masking layer is preferably composed of silicon nitride. The silicon nitride masking layer 18 preferably has a thickness in a range of between about 1000 and 3000 Å. The silicon nitride layer 18 can be formed by reacting silane and ammonia at atmospheric pressure at 700° to 900° C., or by reacting dichlorosilane and ammonia at reduced pressure at approximately 700° C. Also, silicon nitride can be formed by plasma enhanced chemical vapor deposition by reacting silane with ammonia or nitrogen in a glow discharge between 200° and 350° C.

Still referring to FIG. 2, an opening 19 is formed in the pad oxide layer 14 and silicon nitride masking layer 18 over the isolation area 12. The opening 19 defines the field oxide regions 30. The opening can be formed by conventional photolithographic processes. The opening can have any shape and dimension. The opening preferably has a width in a range of between about 0.3 and 1.0 µm.

A field oxide region 30 is formed over the isolation area in the substrate 22. The field oxide is preferably formed by a wet thermal oxidation. The field oxide region 30 can be formed by thermally oxidizing the substrate 10 at a temperature in a range of between about 920° and 1000° C.

The field oxide region 30 preferably has a thickness in a range of between about 2500 and 4000 Å.

As shown in FIG. 3, the masking layer 18 composed of silicon nitride is removed. The silicon nitride masking layer 18 is preferably removed using buffered oxide etch (BOE) 10:1 for about 15 sec and a $H_3PO_4$ etch for about 50 minutes.

The pad oxide layer 14 is then removed. The pad oxide layer 14 can be etched using a HF dip etch or other processes.

In a preferred embodiment, the native oxide on the substrate in the active areas 13 can be substantially removed. The native oxide on the substrate in the active areas 13 is preferably substantially removed using a HF dip etch. The HF dip etch passivates the surface of the substrate in the active area 13 thereby prevents native oxide from growing on the surface of the substrate. The RF dip etch is preferably a 50 to 1 $HF:H_2O$ etch. The HF dip etch prevents native oxide from growing on the substrate surface by forming dangling bonds which stop the silicon from oxidizing.

As shown in FIG. 4, a high N content oxynitride etch barrier protective layer 34 (34A 34B) is formed surrounding (both under and over) the field oxide layer 30. The high N content oxynitride protective layer 34A 34B is preferably formed by heating the substrate in a gas environment comprising ammonia. The high N content oxynitride protective layer 34A 34B is formed by rapidly thermally annealing the substrate at temperature between about 825° and 875° C. in an ammonia containing environment. The preferred process parameters are shown below in table 1.

TABLE 1

Process variables for the high N content oxynitride layer 34

| Variable | units | low limit | target | hi limit |
| --- | --- | --- | --- | --- |
| anneal Temperature | C° | 850 | 900 | 950 |
| Carrier Gasses | Ar | | | |
| Partial pressure of $NH_3$ | Kg/cm2 | 0.5 | 1 | 1.2 |

Figure 7:
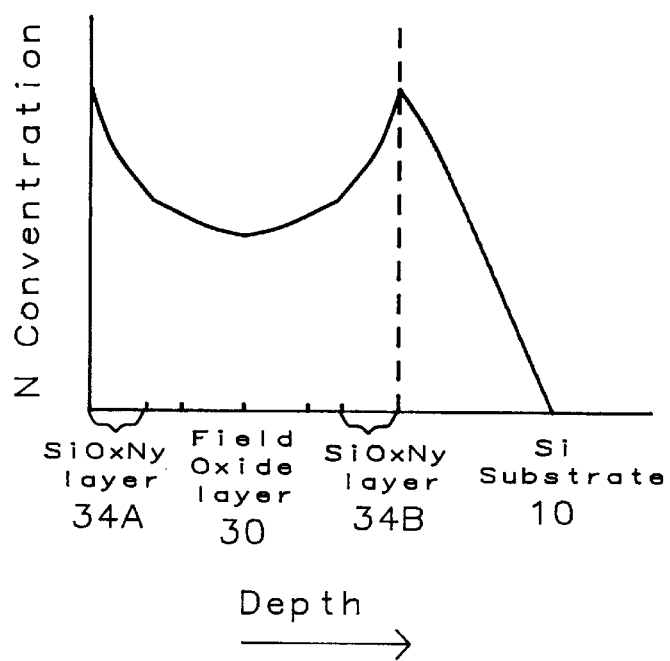
FIG. 7 is a graph showing the Nitrogen concentration in the oxynitride layer 34A 34B and the field oxide 30 as a function of depth.

As shown in FIG. 7, the high N content oxynitride layer 34 (34A 34B) has a Nitrogen concentration gradient where the N concentration is highest at the external areas (toward the surface or substrate) in lower in the internal area (internal portion of the field oxide 30). FIG. 7 shows that the N concentration in the oxynitride layers 34A 34B and field oxide 30 peaks at two places: (1) at the top surface of the field oxide and (2) at the bottom substrate oxynitride 34B/field oxide 30 interface. As shown in FIG. 4, the upper portions $34A_{top}$ of the top oxynitride layer 34A has a nearly stoichiometric (~Si3N4) composition which provide superior etch resistance. A more stoichiometric oxynitride layer (Si to N ratio about 3:4) has the advantage of being very etch resistant. The bottom portions $34A_{bot}$ of the top Oxynitride layer $34A_{bot}$ has a much lower N concentration as shown in FIGS. 4 and 7.

The high N content oxynitride layer 34 preferably has a thickness in a range of between about 50 and 200 Å. A way to ensure an etch resistant oxynitride layer 34 is to perform the anneal at higher $NH_3$ partial pressures.

Figure 5:
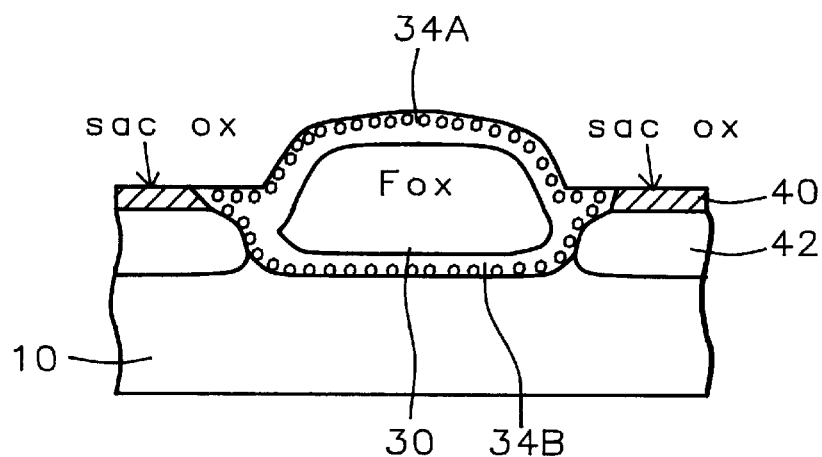

During the ammonia anneal used to form the oxynitride layer 34 (i.e., 34A 34B), an amorphous silicon nitride layer 34C is simultaneously formed over the substrate surface. The ammonia reacts with the silicon surface to form a thin layer of amorphous nitride, which is not wanted. The amorphous silicon nitride layer 34C often has thickness in a range of between about 5 and 20 Å. The amorphous silicon nitride layer 34 C can be removed by itself as shown in FIG. 5. The amorphous nitride layer 34C can be removed together with the top oxynitride layer 34A over the field oxide as explained below.

After the formation of the oxynitride layer 34A 34B, the semiconductor manufacturing process can continue as desired by leaving the top oxynitride layer 34A in place.

Figure 6:
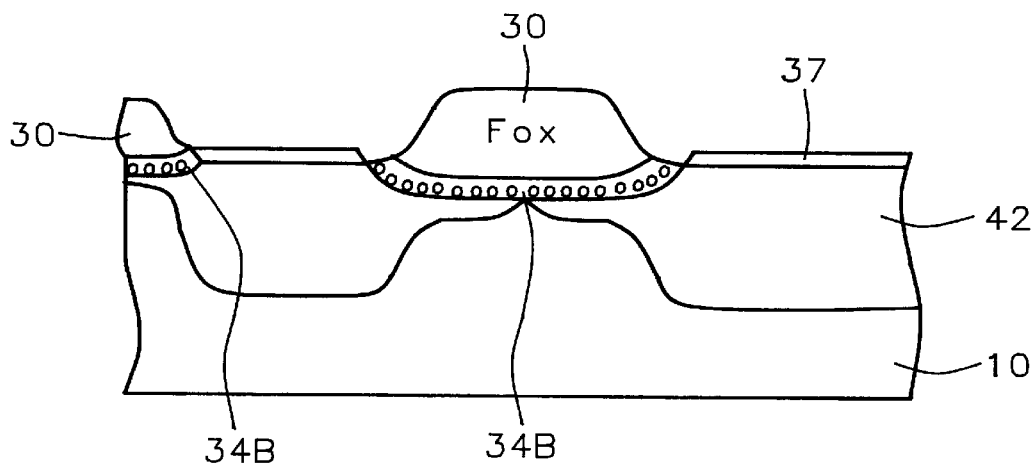

In a preferred embodiment, the top oxynitride layer 34A and the amorphous nitride layer 34C are removed as shown in FIG. 6. Two advantages are gained when the amorphous silicon nitride ($Si_3N_4$) layer 34C and the top oxynitride layer 34A over central area of the field oxide are removed (e.g., by an etch). First, the central area of the field oxide made thinner (planarized - made lower) and is not protected from subsequent etch processes. Second, the thicker oxynitride layer 34A 34B in the outer edges (periphery) of the field oxide remains after the etch and maintains the flat field oxide profile. This way, invention planarizes the field oxide by thinning the oxynitride over the central area and by allowing subsequent etches to etch the field oxide over the central area. The invention also prevents recesses from forming in the peripheral areas of the field oxide.

Below is a description of a preferred to form a retrograde well 42 with the improved field oxide regions 34 and 30 of the invention. (See FIGS. 5–6). Next, impurity ions are implanted into the active area forming a retrograde well 42. The implant is preferably performed by implanting phosphorous (P) ions at an energy in a range of between about 150 and 200 Kev and more preferably of about 380 Kev, and a dose in a range of between about 1E13 and 5E13 atoms/$cm^2$.

As shown in FIGS. 5–6, the impurity ions are driven into the substrate. Also in the drive in process, a drive-in oxide layer 37 is formed over the substrate surface. The drive in oxide layer 37 preferably has a thickness in a range of between about 120 and 250 Å. The retrograde well drive in is preferably performed at a temperature in a range of between about 1040° and 1065° C. and more preferably about 1050° C. At this point the retrograde well 42 has an impurity concentration in a range of between about 1E15 and 1 E 16 atoms/$cm^3$ and a depth below the substrate surface in a range of between about 2000 and 3000 Å.

As shown in FIG. 5, a sacrificial oxide layer 40 is formed over the surface of the substrate over the active area 13. A purpose of the sacrificial layer 40 is to removed defects induced the $Si_3N_4$ formation. The sacrificial oxide layer 40 is preferably formed using a dry thermal oxidation process at a temperature in a range of between about 840° and 860° C. and more preferably of about 850° C. The sacrificial oxide layer 40 preferably has a thickness in a range of between about 180 and 220 Å and more preferably of about 200 Å.

Next, as shown in FIG. 6, the drive-in oxide layer 44 and the sacrificial oxide layer 40 are etched away. The nitride layer 34A 34B protects the field oxide in the periphery from being etched and recess being formed during these etches.

Afterward, conventional processes are performed to produce semiconductor devices. For example the following steps can be performed: gate oxide growth, polysilicon gate formation, source /drain implant, gate sidewall spacers, LLD implant, etch removal of sidewall spacers, formation of resistors, etc. The oxynitride layer 34 A protects the field oxide during an of the subsequent etches, for example, the etch removal of the sidewall spacers.

The invention provides several advantages over the prior art processes. The method of the current invention forms a high N content oxynitride etch barrier layer 34A 34B under and over the field oxide regions. The etch barrier layer 34A 34B protects the field oxide from being excessively etched by subsequent etches which form recesses in the field oxide, such as etches for sacrificial oxide removal, spacer formation etch, resistor protective oxide removal, etc.

Two advantages are gained when the top oxynitride layer 34A over central area of the field oxide is removed (e.g., by an etch). First, the central area of the field oxide is not protected from subsequent etch processes and will be planarized (thinned). Second, the thicker oxynitride layer 34A 34B in the outer edges (periphery) of the field oxide remains after the etches and maintains the flat profile. This way, invention planarizes the field oxide by thinning the oxynitride over the central area and by allowing subsequent etches to etch the field oxide over the central area. The invention also prevents recesses from forming in the peripheral areas of the field oxide.

It should be will understood by one skilled in the art that by including additional process steps not described in this embodiment, other types of devices can also be included on the semiconductor chip. It should also be understood that the figures depict only one field oxide region out of a multitude of field oxide regions that are fabricated simultaneously on the substrate.

While the invention has been particularly shown and described with reference to the preferred embodiments thereof, it will be understood by those skilled in the art that various changes in form and details may be made without departing from the spirit and scope of the invention.

What is claimed is:

1. A method forming a oxynitride layer surrounding a field oxide region comprising the steps of:
   a) forming a field oxide region in a semiconductor substrate, said field oxide region having a peripheral area and a central area;
   b) forming a oxynitride layer surrounding said field oxide region, said oxynitride layer comprising a top oxynitride layer and a bottom oxynitride layer, said top oxynitride layer and bottom oxynitride layer joining over said peripheral area of said field oxide region; and
   c) removing said top oxynitride layer from over said central area of said field oxide region.

2. The method of claim 1 which further includes after forming said field oxide region, the surface of said semiconductor substrate having a native oxide layer, and substantially removing said native oxide from the surface of said semiconductor substrate.

3. The method of claim 1 which further includes after forming said field oxide region, the surface of said semiconductor substrate having a native oxide layer, and substantially removing said native oxide from the surface of said semiconductor substrate by a HF etch.

4. The method of claim 1 wherein said oxynitride layer is formed by heating said substrate in an ammonia gas environment.

5. The method of claim 1 wherein said field oxide region formed by thermally oxidizing said substrate at a temperature in a range of between about 920° and 1000° C.

6. The method of claim 1 wherein said oxynitride layer is formed by rapid thermal annealing said substrate at temperature between about 825° and 875° C. in an ammonia containing environment with an ammonia partial pressure in a range of between about 0.5 and 1.2 kg/cm$^2$.

7. The method of claim 1 wherein said oxynitride layer has a thickness in a range of between about 50 and 200 Å.

8. A method forming a oxynitride layer over a field oxide region comprising the steps of:
   a) sequentially forming a pad oxide layer and a silicon nitride masking layer composed of silicon nitride over a substrate, said substrate having at least an active area and an isolation area;
   b) forming an opening in said silicon nitride masking layer over said isolation area;
   c) forming a field oxide region over said isolation area in said substrate; said field oxide region having a peripheral area and a central area;
   d) removing said silicon nitride masking layer;
   e) etching said pad oxide layer and said substrate in said active area using a HF dip etch; the HF dip etch completely removing said pad oxide layer and passivating the surface of said substrate in said active area thereby preventing native oxide from growing on said surface of said substrate;
   f) forming a top oxynitride layer over said field oxide layer, said top oxynitride layer formed by heating said substrate in a gas environment comprising ammonia with an ammonia partial pressure in a range of between about 0.5 and 1.2 kg/cm$^2$; and
   g) removing said top oxynitride layer from over said central area of said field oxide region.

9. The method of claim 8 which further includes:
   h) removing said top oxynitride layer over said central area of said field oxide region;
   i) implanting impurity ions into said active area forming a retrograte well;
   j) driving in said retrograde well and forming a drive-in oxide layer over the substrate surface;
   k) forming a sacrificial oxide layer over said surface of said substrate over said active area; and
   l) etching said drive-in oxide layer and said sacrificial oxide layer; and
   m) forming a gate oxide layer over the substrate surface.

10. The method of claim 8 wherein said pad oxide layer has a thickness in a range of between about 100 and 120 Å.

11. The method of claim 8 wherein said silicon nitride masking layer has a thickness in a range of between about 1000 and 3000 Å.

12. The method of claim 8 wherein said field oxide region is formed by thermally oxidizing said substrate at a temperature in a range of between about 920° and 1000° C.

13. The method of claim 8 wherein said pad oxide layer is removed using a HF dip etch.

14. The method of claim 8 wherein said a oxynitride layer is formed by rapid thermal annealing said substrate at temperature between about 825° and 875° C. in an ammonia containing environment.

15. The method of claim 8 wherein said oxynitride layer has a thickness in a range of between about 400 and 800 Å.

16. A method forming a oxynitride layer over a field oxide region comprising the steps of:
   a) forming a field oxide region over said isolation area in said substrate; said field oxide region having a peripheral area and a central area;
   b) forming a top oxynitride layer over said field oxide layer, said top oxynitride layer formed by heating said substrate in a gas environment comprising ammonia; and
   c) removing said top oxynitride layer from over said central area of said field oxide region whereby said top oxynitride layer remaining in said peripheral area.

* * * * *